United States Patent
Hsu et al.

(10) Patent No.: US 12,362,275 B2
(45) Date of Patent: *Jul. 15, 2025

(54) METHOD OF FABRICATING PACKAGE STRUCTURE INCLUDING A PLURALITY OF ANTENNA PATTERNS

(71) Applicant: Taiwan Semiconductor Manufacturing Company, Ltd., Hsinchu (TW)

(72) Inventors: Sen-Kuei Hsu, Kaohsiung (TW); Hsin-Yu Pan, Taipei (TW); Yi-Che Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/672,001

(22) Filed: May 23, 2024

(65) Prior Publication Data

US 2024/0312904 A1    Sep. 19, 2024

Related U.S. Application Data

(63) Continuation of application No. 17/870,798, filed on Jul. 21, 2022, now Pat. No. 12,021,024, which is a
(Continued)

(51) Int. Cl.
*H01L 23/522*    (2006.01)
*H01L 21/48*    (2006.01)
(Continued)

(52) U.S. Cl.
CPC ...... *H01L 23/5226* (2013.01); *H01L 21/4871* (2013.01); *H01L 21/56* (2013.01);
(Continued)

(58) Field of Classification Search
CPC . H01L 23/5226; H01L 23/36; H01L 21/4871; H01L 21/56; H01L 2223/6677; H01L 23/3114; H01L 23/3128
See application file for complete search history.

(56) References Cited

U.S. PATENT DOCUMENTS 8,063,475 B2 * 11/2011 Choi ............... H01L 24/73
257/E21.511
8,319,349 B2 * 11/2012 Hu ............... H01L 21/561
257/774

(Continued)

*Primary Examiner* — Khiem D Nguyen
(74) *Attorney, Agent, or Firm* — JCIPRNET

(57) ABSTRACT

A package structure includes a semiconductor die, an insulating encapsulant, a first redistribution layer, a second redistribution layer, a heat dissipation element and conductive balls. The insulating encapsulant is encapsulating the semiconductor die, and has a first surface and a second surface opposite to the first surface. The first redistribution layer is located on the first surface of the insulating encapsulant and includes at least one feed line and one ground plate. The second redistribution layer is located on the second surface of the insulating encapsulant and electrically connected to the semiconductor die and the first redistribution layer. The heat dissipation element is disposed on the first redistribution layer and includes a conductive base and antenna patterns, wherein the antenna patterns is electrically connected to the feed line and is electrically coupled to the ground plate of the first redistribution layer.

20 Claims, 11 Drawing Sheets

Related U.S. Application Data continuation of application No. 17/079,525, filed on Oct. 26, 2020, now Pat. No. 11,444,023, which is a continuation of application No. 16/262,924, filed on Jan. 31, 2019, now Pat. No. 10,818,588.

(51) Int. Cl.
  *H01L 21/56* (2006.01)
  *H01L 23/00* (2006.01)
  *H01L 23/31* (2006.01)
  *H01L 23/36* (2006.01)
  *H01L 23/528* (2006.01)

(52) U.S. Cl.
  CPC ...... *H01L 23/3114* (2013.01); *H01L 23/3128* (2013.01); *H01L 23/36* (2013.01); *H01L 23/5283* (2013.01); *H01L 24/09* (2013.01); *H01L 24/17* (2013.01); *H01L 24/32* (2013.01); *H01L 2224/0231* (2013.01); *H01L 2224/02331* (2013.01); *H01L 2224/02373* (2013.01); *H01L 2224/02379* (2013.01); *H01L 2224/73253* (2013.01)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,831,148 B2 * | 11/2017 | Yu .............. H01L 24/20 |
| 10,163,802 B2 * | 12/2018 | Lin .............. H01L 25/105 |
| 10,163,803 B1 * | 12/2018 | Chen .............. H01L 24/19 |
| 10,818,588 B2 * | 10/2020 | Hsu .............. H01L 24/17 |
| 11,444,023 B2 * | 9/2022 | Hsu .............. H01L 21/56 |
| 12,021,024 B2 * | 6/2024 | Hsu .............. H01L 23/66 |

\* cited by examiner

METHOD OF FABRICATING PACKAGE STRUCTURE INCLUDING A PLURALITY OF ANTENNA PATTERNS

CROSS-REFERENCE TO RELATED APPLICATION

This application is a continuation application of and claims the priority benefit of U.S. application Ser. No. 17/870,798, filed on Jul. 21, 2022, now patented as U.S. Pat. No. 12,021,024, issued on Jun. 25, 2024. The prior application Ser. No. 17/870,798 is a continuation application of and claims the priority benefit of U.S. application Ser. No. 17/079,525, filed on Oct. 26, 2020, now patented as U.S. Pat. No. 11,444,023, issued on Sep. 13, 2022, which is a continuation application of and claims the priority benefit of U.S. application Ser. No. 16/262,924, filed on Jan. 31, 2019, now patented as U.S. Pat. No. 10,818,588, issued on Oct. 27, 2020. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
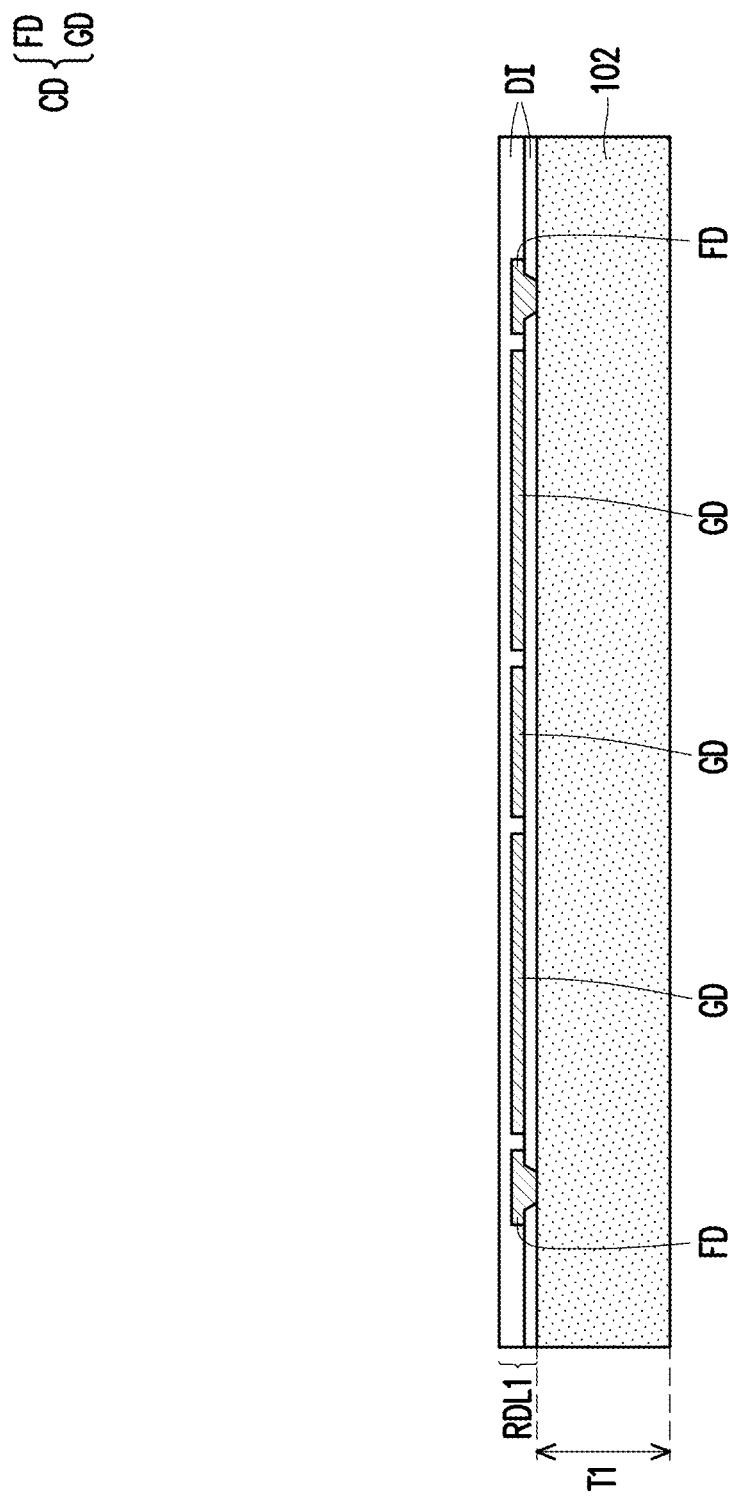
FIG. 1A to FIG. 1G are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic sectional views of various stages in a method of fabricating a package structure according to some exemplary embodiments of the present disclosure. Referring to FIG. 1A, a conductive carrier 102 is provided. The conductive carrier 102 may be any conductive material suitable for forming a heat dissipation element of the disclosure. In some embodiments, the conductive carrier 102 is a metal carrier. In certain embodiments, the conductive carrier 102 is made of aluminum or an alloy thereof. In one exemplary embodiment, a thickness T1 of the conductive carrier 102 may be in a range of 100 μm to 300 μm. However, the disclosure is not limited thereto. In some embodiments, the thickness T1 of the conductive carrier 102 may be suitably adjusted as long as it is sufficient to provide heat dissipation and antenna functions.

After providing the conductive carrier 102, a first redistribution layer RDL1 is formed on the conductive carrier 102. For example, referring to FIG. 1A, the formation of the first redistribution layer RDL1 includes sequentially forming one or more dielectric layers DI and one or more conductive layers CD in alternation. In some embodiments, the first redistribution layer RDL1 includes two dielectric layers DI and one conductive layer CD, wherein the conductive layer CD is sandwiched between the dielectric layers DI. However, the disclosure is not limited thereto. The number of conductive layer CD and dielectric layer DI included in the first redistribution layer RDL1 may be selected and adjusted based on design requirements. For example, the number of the conductive layers and the dielectric layers may be one or more than one. In some embodiments, the conductive layer CD of the first redistribution layer RDL1 may include feed lines FD and ground plates GD, which are to be used with antenna patterns formed thereafter. In certain embodiments, the feed line FD is physically and electrically connected to the conductive carrier 102. It should be noted that the arrangement of the feed lines FD and the ground plates GD shown in FIG. 1A are merely for illustrative purposes, and their actual arrangement may depend on the position of the antenna patterns.

In certain embodiments, the material of the dielectric layers DI may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers DI may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer CD may be made of conductive materials formed by electroplating or deposition, such as aluminum, titanium, copper, nickel, tungsten, and/or alloys thereof, which may be patterned using a photolithography and etching process. In some embodiments, the conductive layer CD may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 1B:
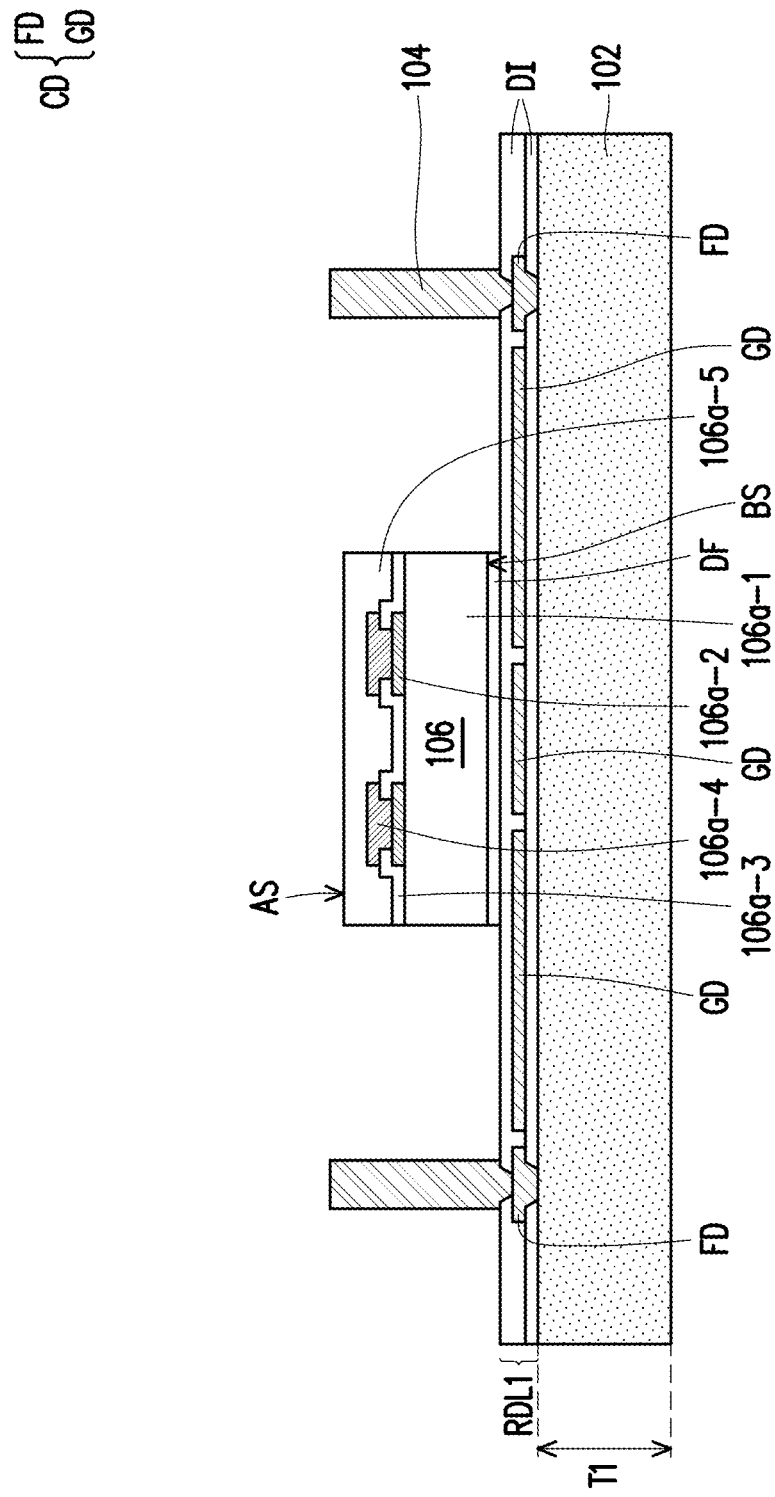

Referring to FIG. 1B, after forming the first redistribution layer RDL1, at least one semiconductor die 106 and a plurality of through insulator vias 104 are provided on the first redistribution layer RDL over the conductive carrier 102. In some embodiments, the through insulator vias 104 are through integrated fan-out ("InFO") vias. In one embodiment, the formation of the through insulator vias 104 includes forming a mask pattern (not shown) with openings, then forming a metallic material (not shown) filling up the openings by electroplating or deposition, and removing the mask pattern to form the through insulator vias 104 on the first redistribution layer RDL1. In certain embodiments, the through insulator vias 104 fills into a via opening that reveals the conductive layer CD of the first redistribution layer RDL1, so that the through insulator vias 104 may be electrically connected to the first redistribution layer RDL1. In some embodiments, the material of the mask pattern may include a positive photo-resist or a negative photo-resist. In one embodiment, the material of the through insulator vias 104 may include a metal material such as copper or copper alloys, or the like. However, the disclosure is not limited thereto.

In an alternative embodiment, the through insulator vias 104 may be formed by forming a seed layer (not shown) on the first redistribution layer RDL1; forming the mask pattern with openings exposing portions of the seed layer; forming the metallic material on the exposed portions of the seed layer to form the through insulator vias 104 by plating; removing the mask pattern; and then removing portions of the seed layer exposed by the through insulator vias 104. For example, the seed layer may be a titanium/copper composited layer. For simplification, only two through insulator vias 104 are illustrated in FIG. 1B. However, it should be noted that the number of through insulator vias 104 is not limited thereto, and can be selected based on requirement.

Furthermore, as illustrated in FIG. 1B, at least one semiconductor die 106 is picked and placed on the first redistribution layer RDL1. In certain embodiments, the semiconductor die 106 has an active surface AS, and a backside surface BS opposite to the active surface AS. For example, the backside surface BS of the semiconductor die 106 may be attached to the first redistribution layer RDL1 through a die attach film DF. By using the die attach film DF, a better adhesion between the semiconductor die 106 and the first redistribution layer RDL1 is ensured. In the exemplary embodiment, only one semiconductor die 106 is illustrated. However, it should be noted that the number of semiconductor dies placed on the first redistribution layer RDL1 is not limited thereto, and this can be adjusted based on design requirement.

In the exemplary embodiment, the semiconductor die 106 includes a semiconductor substrate 106a-1, a plurality of conductive pads 106a-2, a passivation layer 106a-3, a plurality of conductive posts 106a-4, and a protection layer 106a-5. As illustrated in FIG. 1B, the plurality of conductive pads 106a-2 is disposed on the semiconductor substrate 106a-1. The passivation layer 106a-3 is formed over the semiconductor substrate 106a-1 and has openings that partially expose the conductive pads 106a-2 on the semiconductor substrate 106a-1. The semiconductor substrate 106a-1 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106a-2 may be aluminum pads, copper pads or other suitable metal pads. The passivation layer 106a-3 may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer 106a-3. The post-passivation layer covers the passivation layer 106a-3 and has a plurality of contact openings. The conductive pads 106a-2 are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 106a-4 are formed on the conductive pads 106a-2 by plating. In some embodiments, the protection layer 106a-5 is formed on the passivation layer 106a-3 or on the post passivation layer, and covering the conductive posts 106a-4 so as to protect the conductive posts 106a-4.

In some embodiments, when more than one semiconductor die 106 are placed on the first redistribution layer RDL1, the semiconductor dies 106 may be arranged in an array, and when the semiconductor dies 106 are arranged in an array, the through insulator vias 104 may be classified into groups. The number of the semiconductor dies 106 may correspond to the number of groups of the through insulator vias 104. In the exemplary embodiment, the semiconductor die 106 may be picked and placed on the first redistribution layer RDL1 after the formation of the through insulator vias 104. However, the disclosure is not limited thereto. In some alternative embodiments, the semiconductor die 106 may be picked and placed on the first redistribution layer RDL1 before the formation of the through insulator vias 104.

In some embodiments, the semiconductor die 106 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1C:
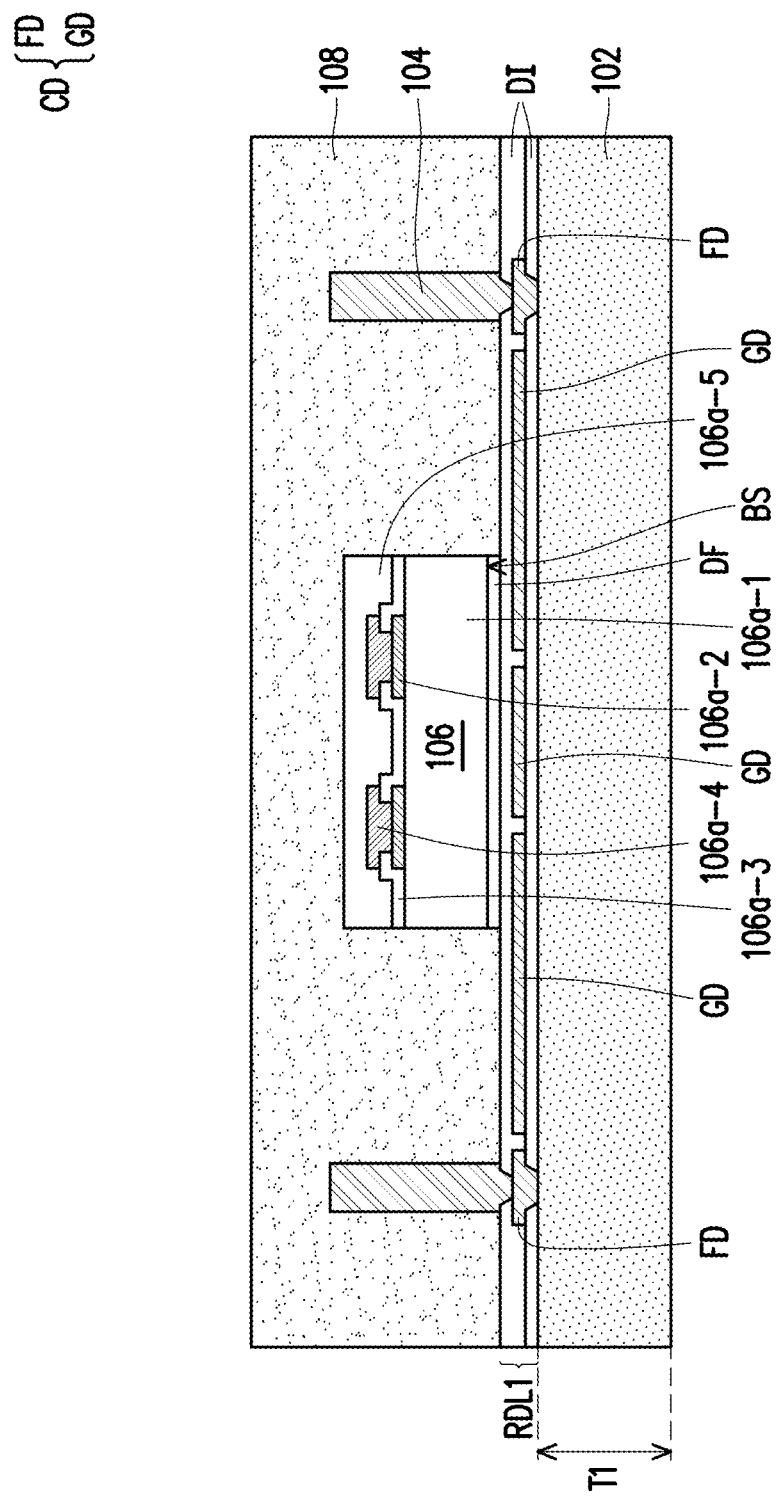

Referring to FIG. 1C, an insulating material 108 is formed on the first redistribution layer RDL1 and over the semiconductor die 106. In some embodiments, the insulating material 108 is formed through, for example, a compression molding process, filling up the gaps between the semiconductor die 106 and the through insulating vias 104 to encapsulate the semiconductor die 106. The insulating material 108 also fills up the gaps between adjacent through insulator vias 104 to encapsulate the through insulator vias 104. The conductive posts 106a-4 and the protection layer 106a-5 of the semiconductor die 106 are encapsulated by and well protected by the insulating material 108. In other words, the conductive posts 106a-4 and the protection layer 106a-5 of the semiconductor die 106 are not revealed and are well protected by the insulating material 108.

In some embodiments, the insulating material 108 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 1D:
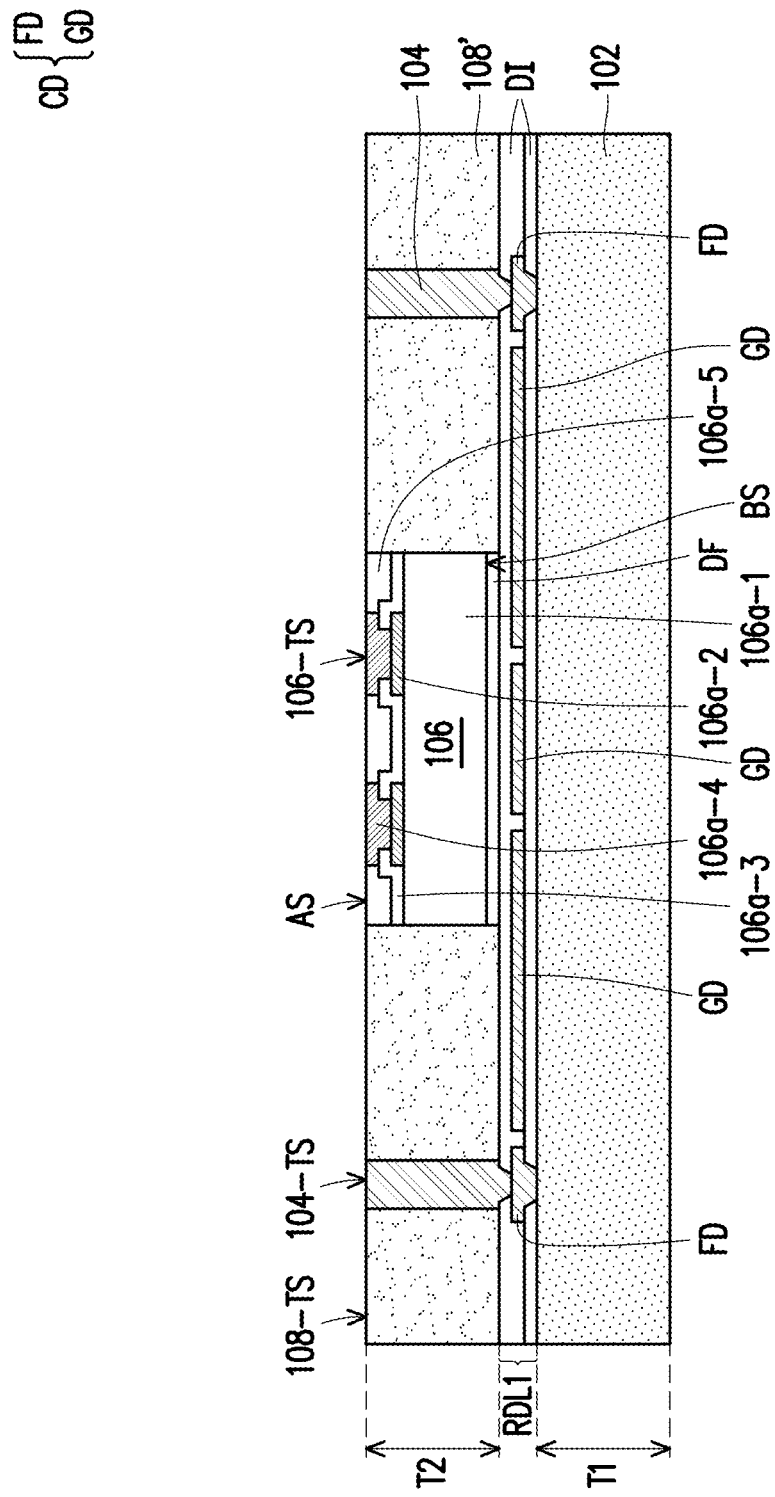

Referring to FIG. 1D, in some embodiments, the insulating material 108 is partially removed to expose the conductive posts 106a-5 and the through insulator vias 104. In some embodiments, the insulating material 108 and the protection layer 106a-5 are ground or polished by a planarization step. For example, the planarization step is performed through a mechanical grinding process and/or a chemical mechanical polishing (CMP) process until the top surfaces 106-TS of the conductive posts 106a-4 are revealed. In some embodiments, the through insulator vias 104 may be partially polished so that the top surfaces 104-TS of the through insulator vias 104 are levelled with the top surfaces 106-TS of the conductive posts 106a-4, or levelled with the active surface AS of the semiconductor die 106. In other words, the conductive posts 106a-4 and the through insulator vias 104 may also be slightly grinded/polished.

In the illustrated embodiment, the insulating material 108 is polished to form an insulating encapsulant 108'. In some embodiments, the top surface 108-TS of the insulating encapsulant 108', the top surface 104-TS of the through insulator vias 104, the top surface 106-TS of the conductive posts 106a-4, and the top surface of the polished protection layer 106a-5 are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1E:
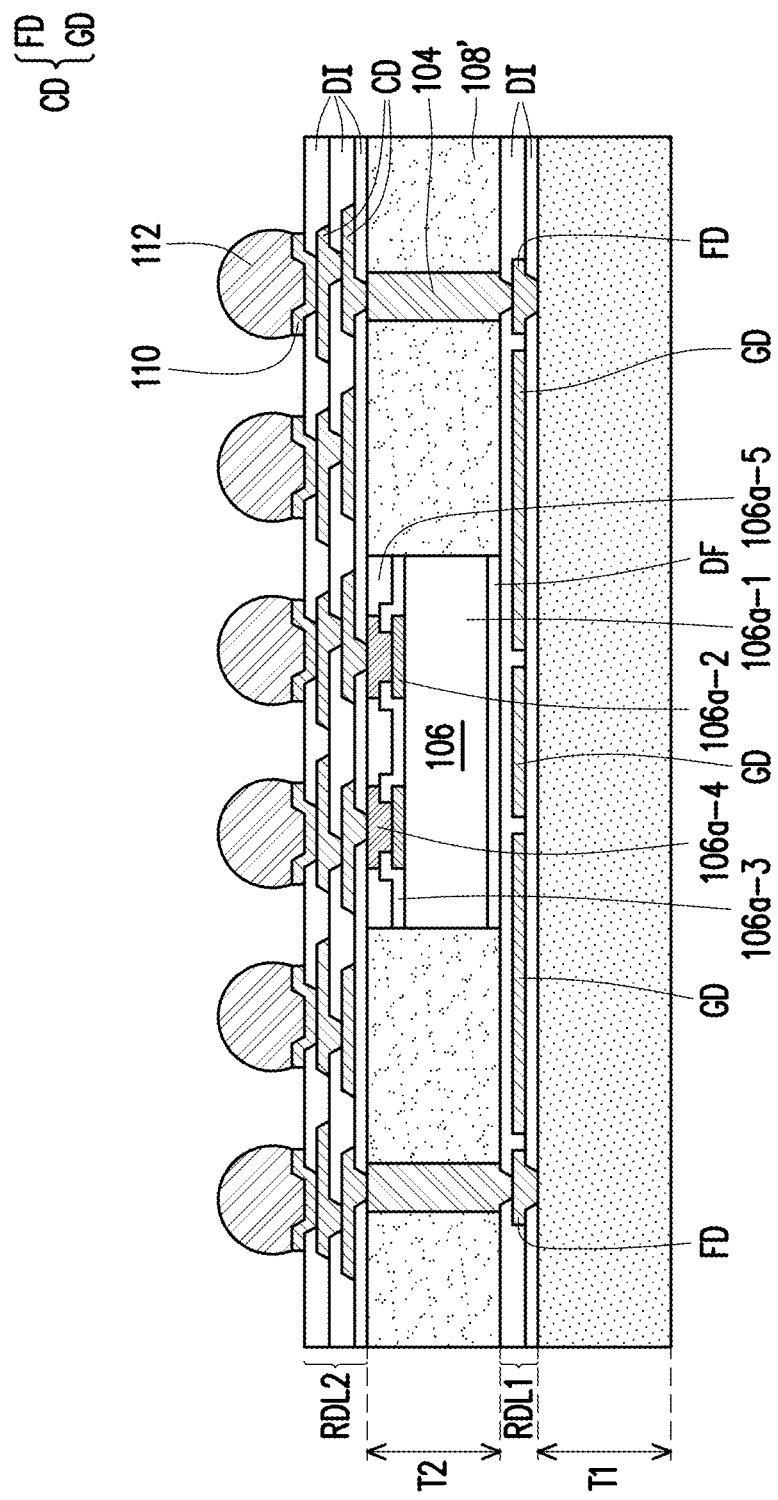

Referring to FIG. 1E, after the planarization step, a second redistribution layer RDL2 is formed on the insulating encapsulant 108', the through insulator vias 104 and the semiconductor die 106. For example, the second redistribution layer RDL2 is formed on the top surface 104-TS of the through insulator vias 104, on the top surface 106-TS of the conductive posts 106a-4, and on the top surface 108-TS of the insulating encapsulant 108'. In some embodiments, the second redistribution layer RDL2 is electrically connected to the through insulator vias 104, and is electrically connected to the semiconductor die 106 through the conductive posts 106a-4. In some embodiments, the semiconductor die 106 is electrically connected to the through insulator vias 104 through the second redistribution layer RDL2.

In some embodiments, the formation of the second redistribution layer RDL2 includes sequentially forming one or more dielectric layers DI, and one or more conductive layers CD in alternation. In certain embodiments, the conductive layers CD are sandwiched between the dielectric layers DI. Although only two layers of the conductive layers CD and three layers of dielectric layers DI are illustrated herein, however, the scope of the disclose is not limited by the embodiments of the disclosure. In other embodiments, the number of conductive layers CD and the dielectric layers DI may be adjusted based on product requirement. In some embodiments, the conductive layers CD are electrically connected to the conductive posts 106a-4 of the semiconductor die 106. Furthermore, the conductive layers CD are electrically connected to the through insulator vias 104.

In some embodiments, the materials of the dielectric layer DI and the conductive layer CD of the second redistribution layer RDL2 is similar to a material of the dielectric layer DI and the conductive layer CD mentioned for the first redistribution layer RDL1. Therefore, the detailed description of the dielectric layer DI and the conductive layer CD will be omitted herein.

After forming the second redistribution layer RDL, a plurality of conductive pads 110 may be disposed on an exposed top surface of the topmost layer of the conductive layers CD for electrically connecting with conductive balls. In certain embodiments, the conductive pads 110 are for example, under-ball metallurgy (UBM) patterns used for ball mount. As shown in FIG. 1E, the conductive pads 110 are formed on and electrically connected to the second redistribution layer RDL2. In some embodiments, the materials of the conductive pads 110 may include copper, nickel, titanium, tungsten, or alloys thereof or the like, and may be formed by an electroplating process, for example. The number of conductive pads 110 are not limited in this disclosure, and may be selected based on the design layout. In some alternative embodiments, the conductive pads 110 may be omitted. In other words, conductive balls 112 formed in subsequent steps may be directly disposed on the second redistribution layer RDL2.

After forming the conductive pads 110, a plurality of conductive balls 112 is disposed on the conductive pads 110 and over the second redistribution layer RDL2. In some embodiments, the conductive balls 112 may be disposed on the conductive pads 110 by a ball placement process or reflow process. In some embodiments, the conductive balls 112 are, for example, solder balls or ball grid array (BGA) balls. In some embodiments, the conductive balls 112 are connected to the second redistribution layer RDL2 through the conductive pads 110. In certain embodiments, some of the conductive balls 112 may be electrically connected to the semiconductor die 106 through the second redistribution layer RDL2. Furthermore, some of the conductive balls 112 may be electrically connected to the through insulator vias 104 through the second redistribution layer RDL2. The number of the conductive balls 112 is not limited to the disclosure, and may be designated and selected based on the number of the conductive pads 110. In some alternative embodiments, an integrated passive device (IPD) (not shown) may optionally be disposed on the second redistribution layer RDL2 and electrically connected to the second redistribution layer RDL2.

Figure 1F:
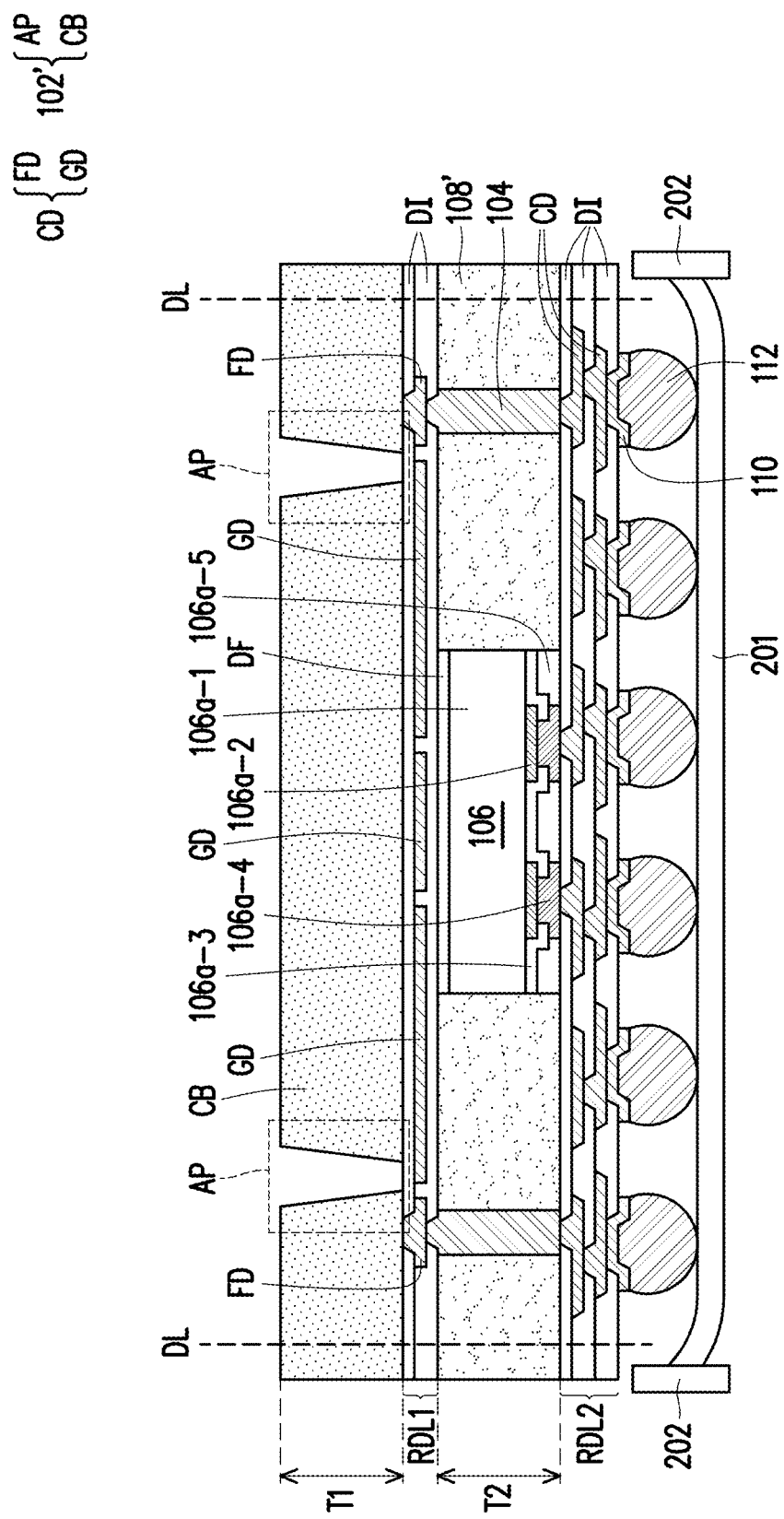

Referring to FIG. 1F, in some embodiments, after forming the second redistribution layer RDL2 and the conductive balls 112, the structure shown in FIG. 1E may be turned upside down and attached to a tape 201 supported by a frame 202. Subsequently, the conductive carrier 102 is patterned to form a heat dissipation element 102' comprising a conductive base CB and a plurality of antenna patterns AP. In some embodiments, the plurality of antenna patterns AP is electrically connected to the feed line FD of the first redistribution layer RDL1. Furthermore, the plurality of antenna patterns AP is electrically coupled to the ground plate GD of the first redistribution layer RDL1. In some embodiments, the plurality of antenna patterns AP may be formed by a suitable fabrication technique such as patterning the conductive carrier 102 by a laser drilling process or a chemical etching process. In alternative embodiments, the conductive carrier 102 may be patterned to form the conductive base CB, and the plurality of antenna patterns AP are further disposed on the conductive base CB. In one embodiment, the plurality of antenna patterns AP is integrally formed together with the conductive based CB. In other words, the antenna patterns AP are directly defined on the conductive base CB. As illustrated in FIG. 1F, the antenna patterns AP are for example slot antenna patterns or loop antenna patterns. However, the disclosure is not limited thereto, and the design of the antenna patterns may be adjusted based on product requirement. The details of the design of different antenna patterns AP that may be applied will be described in a later section.

Figure 1G:
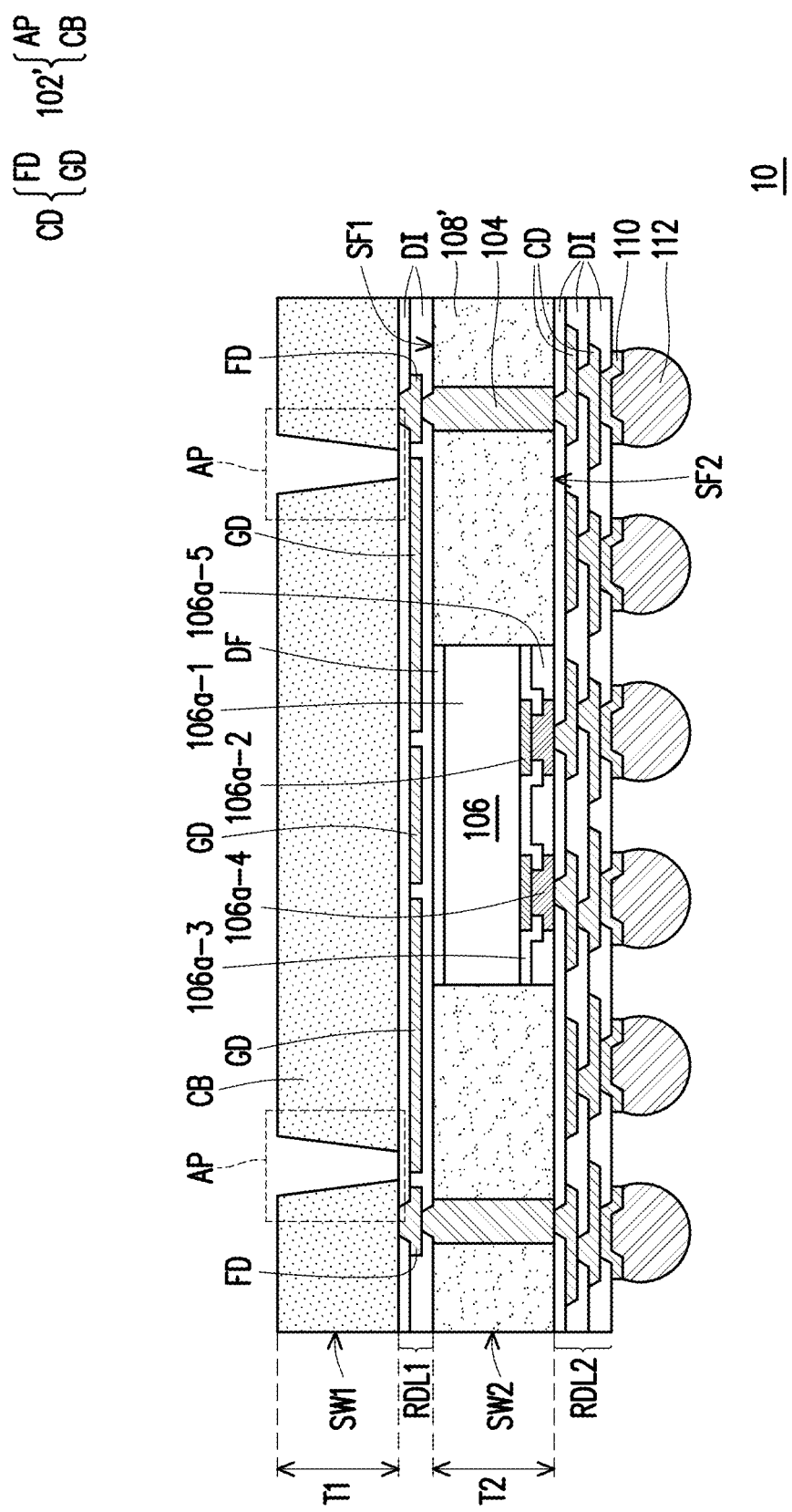

After forming the heat dissipation element 102' having a conductive base CB and antenna patterns AP, a dicing process is performed along the dicing line DL to cut the wafer structure into individual and separated package structures 10 as shown in FIG. 1G. In one embodiment, the dicing process is a wafer dicing process including mechanical blade sawing or laser cutting. Up to here, the manufacture of the package structure 10 is completed.

Referring to FIG. 1G, in the package structure 10, the conductive base CB of the heat dissipation element 102' function as a heat sink responsible for providing heat dissipation function, while the antenna patterns AP of the heat dissipation element 102' are responsible for providing the antenna function. In some embodiments, a ratio of a thickness T1 of the heat dissipation element 102' to a thickness T2 of the insulating encapsulant 108' is in a range of 1:1 to 1:5. In some embodiments, a ratio of the thickness T1 of the heat dissipation element 102' to the thickness T2 of the insulating encapsulant 108' is in a range of 1:1 to 1:4. In certain embodiments, a ratio of the thickness T1 of the heat dissipation element 102' to the thickness T2 of the insulating encapsulant 108' is in a range of 1:1 to 1:3. By controlling the thickness T1 of the heat dissipation element 102' and the thickness T2 the insulating encapsulant 108' in such a range, the heat dissipation function as well as antenna function of the heat dissipation element 102' can be ensured.

In the exemplary embodiment, the heat dissipation element 102' is in physical contact with the feed line FD of the first redistribution layer RDL1. For example, the conductive base CB or the antenna patterns AP of the heat dissipation element 102' may be contacting the feed line FD of the first redistribution layer RDL1. In some embodiments, the sidewalls SW1 of the heat dissipation element 102' is aligned with the sidewalls SW2 of the insulating encapsulant 108'. In certain embodiments, the sidewalls SW1 of the heat dissipation element 102' and the sidewalls SW2 of the insulating encapsulant 108' are further aligned with sidewalls of the first redistribution layer RDL1 and the second redistribution layer RDL2. In some embodiments, the insulating encapsulant 108' includes a first surface SF1 and a second surface SF2 opposite to the first surface SF1. In certain embodiments, the first redistribution layer RDL1 is located on the first surface SF1, and the second redistribution layer is located on the second surface SF2 of the insulating encapsulant 108'. In the exemplary embodiment, since a conductive carrier 102 is used in replacement of conventional carriers (e.g. glass carriers), a heat dissipation element 102' having heat dissipation and antenna functions can be directly formed on the first redistribution layer RDL1 by patterning the conductive carrier 102. As such, it is possible to design a heatsink and antenna in a single package for simultaneously achieving thermal dissipation and radiation purposes.

FIG. 2A to FIG. 2D are schematic views of the heat dissipation element of the package structure according to various exemplary embodiments of the present disclosure. As noted above, the conductive carrier 102 may be patterned to form a heat dissipation element 102' comprising a conductive base CB and a plurality of antenna patterns AP. The embodiments of forming different heat dissipation elements 102' will be explained below.

Figure 2A:
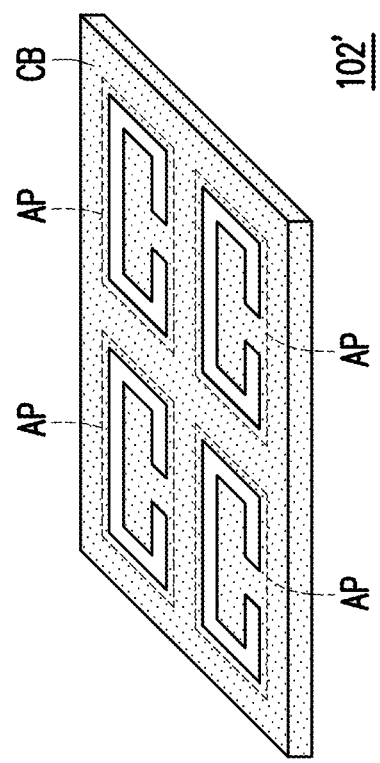
FIG. 2A to FIG. 2D are schematic views of the heat dissipation element of the package structure according to various exemplary embodiments of the present disclosure.

Referring to FIG. 2A, a heat dissipation element 102' is formed by patterning the conductive carrier 102 (step described in FIG. 1F) to define a plurality of slot antenna patterns AP on the conductive base CB. In the exemplary embodiment, the slot antenna patterns AP are formed by laser drilling or chemical etching to define a plurality of slot openings on the conductive base CB. In some embodiments, the slot antenna patterns AP are integrally formed with the conductive base CB. In other words, the slot antenna pattern AP and the conductive base CB are formed on the same plane and are coplanar to one another. In certain embodiments, a height of the slot antenna patterns AP is equal to a height of the conductive base CB. In the exemplary embodiment, the slot antenna patterns AP and the conductive base CB may be physically and electrically connected to a feed line FD of the first redistribution layer RDL1. Furthermore, the slot antenna patterns AP may be electrically coupled to a ground plate GD of the first redistribution layer RDL1. In the embodiment described herein and in the embodiments below, the ground plate GD is a portion of the conductive layer CD (of RDL1) that is overlapped with the antenna patterns AP, whereas the feed line FD is another portion of the conductive layer CD (of RDL1) that is connected to the antenna patterns AP for transmitting signals from the semiconductor die 106 to the antenna patterns AP or from the antenna patterns AP to the semiconductor die 106.

Figure 2B:
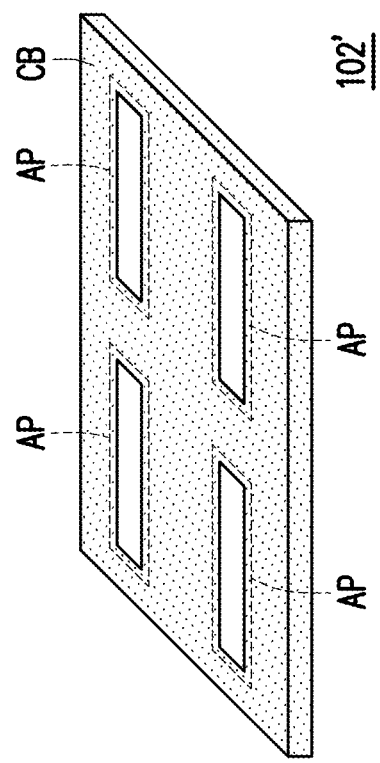

Referring to FIG. 2B, a heat dissipation element 102' is formed by patterning the conductive carrier 102 (step described in FIG. 1F) to define a plurality of loop antenna patterns AP on the conductive base CB. In the exemplary embodiment, the loop antenna patterns AP are formed by laser drilling or chemical etching to define a plurality of loop openings on the conductive base CB. That is, each of the openings has a loop-like or ring-like pattern. In some embodiments, the loop antenna patterns AP are integrally formed with the conductive base CB. In other words, the loop antenna pattern AP and the conductive base CB are formed on the same plane and are coplanar to one another. In certain embodiments, a height of the loop antenna patterns AP is equal to a height of conductive base CB. In the exemplary embodiment, the loop antenna patterns AP and the conductive base CB may be physically and electrically connected to a feed line FD of the first redistribution layer RDL1. Furthermore, the loop antenna patterns AP may be electrically coupled to a ground plate GD of the first redistribution layer RDL1.

Figure 2D:
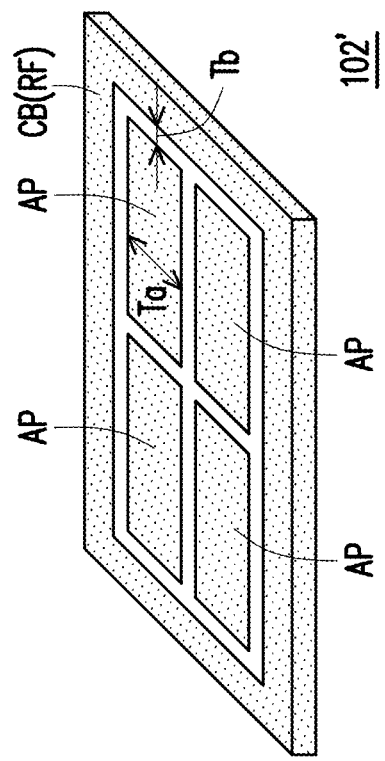
Figure 2C:
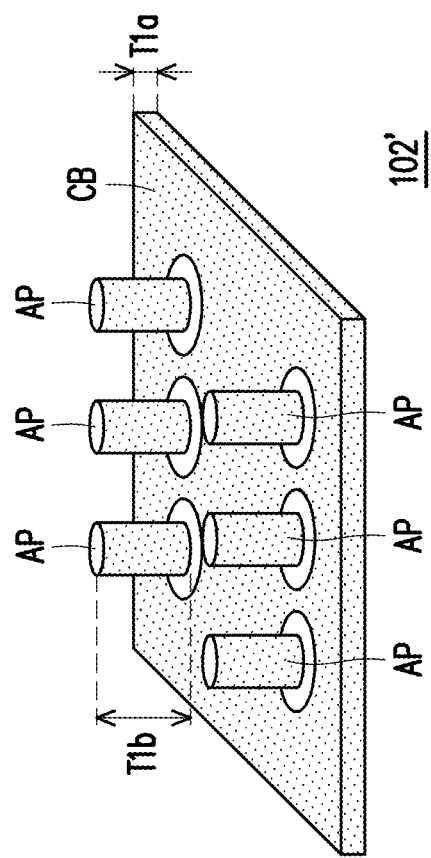

Referring to FIG. 2C, a heat dissipation element 102' is formed by patterning the conductive carrier 102 (step described in FIG. 1F) to define a plurality of monopole antenna patterns AP partially surrounded by and protruding out from the conductive base CB, wherein the monopole antenna patterns AP are isolated from the conductive base CB. In order to define the monopole antenna patterns AP, a thicker conductive carrier 102 may be used as a starting material. For example, in one embodiment, a conductive carrier 102 having a thickness of 300 μm may be used. The conductive carrier 102 may then be patterned by laser drilling or chemical etching to define the monopole antenna patterns AP and the conductive base CB. In an alternative embodiment, the plurality of monopole antenna patterns AP is formed by first patterning the conductive carrier 102 to form a plurality of openings; thereafter, a plurality of conductive poles is disposed or placed in the plurality of openings to define the monopole antenna patterns AP, whereas the monopole antenna patterns AP are isolated from the conductive base CB. The material of the plurality of the conductive poles may be similar to the material of the conductive carrier 102 described above.

In the exemplary embodiment, a ratio of a thickness T1a of the conductive base CB and a height T1b of the plurality of monopole antenna patterns AP protruding out from the conductive base CB is in a range of 1:1.5 to 1:3. For example, in one embodiment, the thickness T1a of the conductive base CB is in a range of 100 μm to 200 μm, while the height T1b of the monopole antenna patterns AP is in a range of 150 μm to 300 μm, wherein T1b is greater than T1a. In some embodiments, the monopole antenna patterns AP may be physically and electrically connected to a feed line FD of the first redistribution layer RDL1. In certain embodiments, the conductive base CB may optionally be connected to a ground plate GD of the first redistribution layer RDL1 or have no connection to the first redistribution layer RDL1. By designing the heat dissipation element 102' to include the monopole antenna patterns AP, a thermal dissipation property of the package structure can be further improved.

Referring to FIG. 2D, a heat dissipation element 102' is formed by patterning the conductive carrier 102 (step described in FIG. 1F) to define a plurality of antenna patterns AP (patch antennas) isolated from the conductive base CB. In the exemplary embodiment, the conductive base CB of the heat dissipation element 102' comprises reflectors RF surrounding the plurality of antenna patterns AP. Furthermore, in the exemplary embodiment, a dimension Ta of the antenna patterns AP may be (½)λ, and a distance Tb between the antenna patterns AP and the reflector RF may be (¼)λ, wherein λ is the wavelength of the electromagnetic wave to be received or transmitted by the antenna patterns AP. The frequency is chosen depending on the demand and the design layout and is not limited in the disclosure. In certain embodiments, the antenna patterns AP may be physically and electrically connected to a feed line FD of the first redistribution layer RDL1. In certain embodiments, the reflectors RF may optionally be connected to a ground plate GD of the first redistribution layer RDL1. By designing the conductive base CB as the reflectors RF, the minimal distance required between the antenna and the ground plate can be significantly reduced, and the surface wave coming from the antenna patterns AP may be stopped. As such, the gain performance of the antennas can be enhanced.

Figure 3:
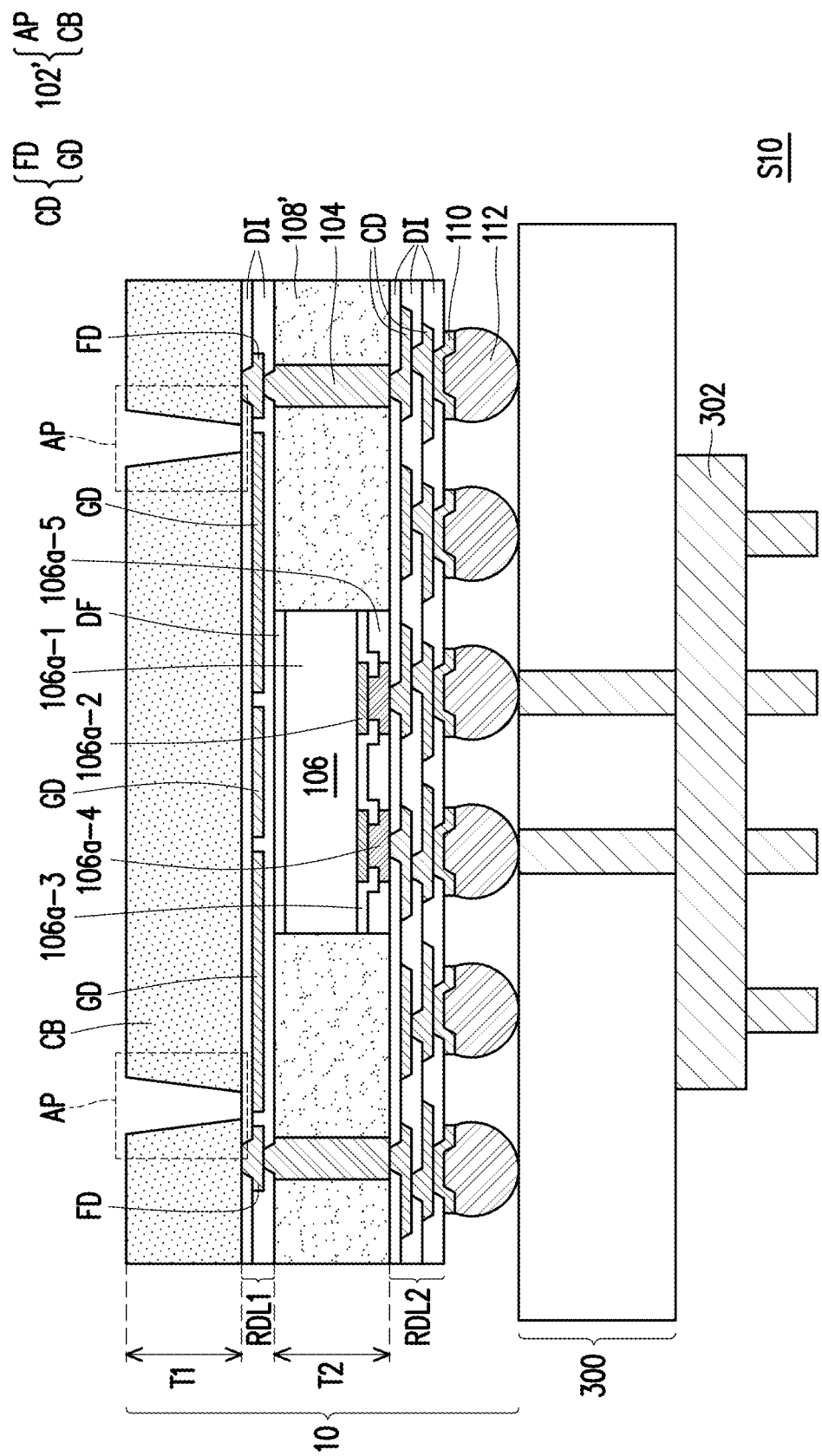
FIG. 3 is a semiconductor device according to some exemplary embodiments of the present disclosure.

FIG. 3 is a semiconductor device according to some exemplary embodiments of the present disclosure. Referring to FIG. 3, in some embodiments, the package structure 10 obtained in FIG. 1G may be further mounted onto a circuit substrate 300 with other packages, passive devices, and connectors (not shown) to form a semiconductor device S10. In certain embodiments, a second heat dissipation element 302 is located on the circuit substrate 300 and electrically connected to the plurality of conductive balls 112 of the package structure 10. By providing the second heat dissipation element 302, the thermal properties of the semiconductor device S10 may be further improved.

Figure 4:
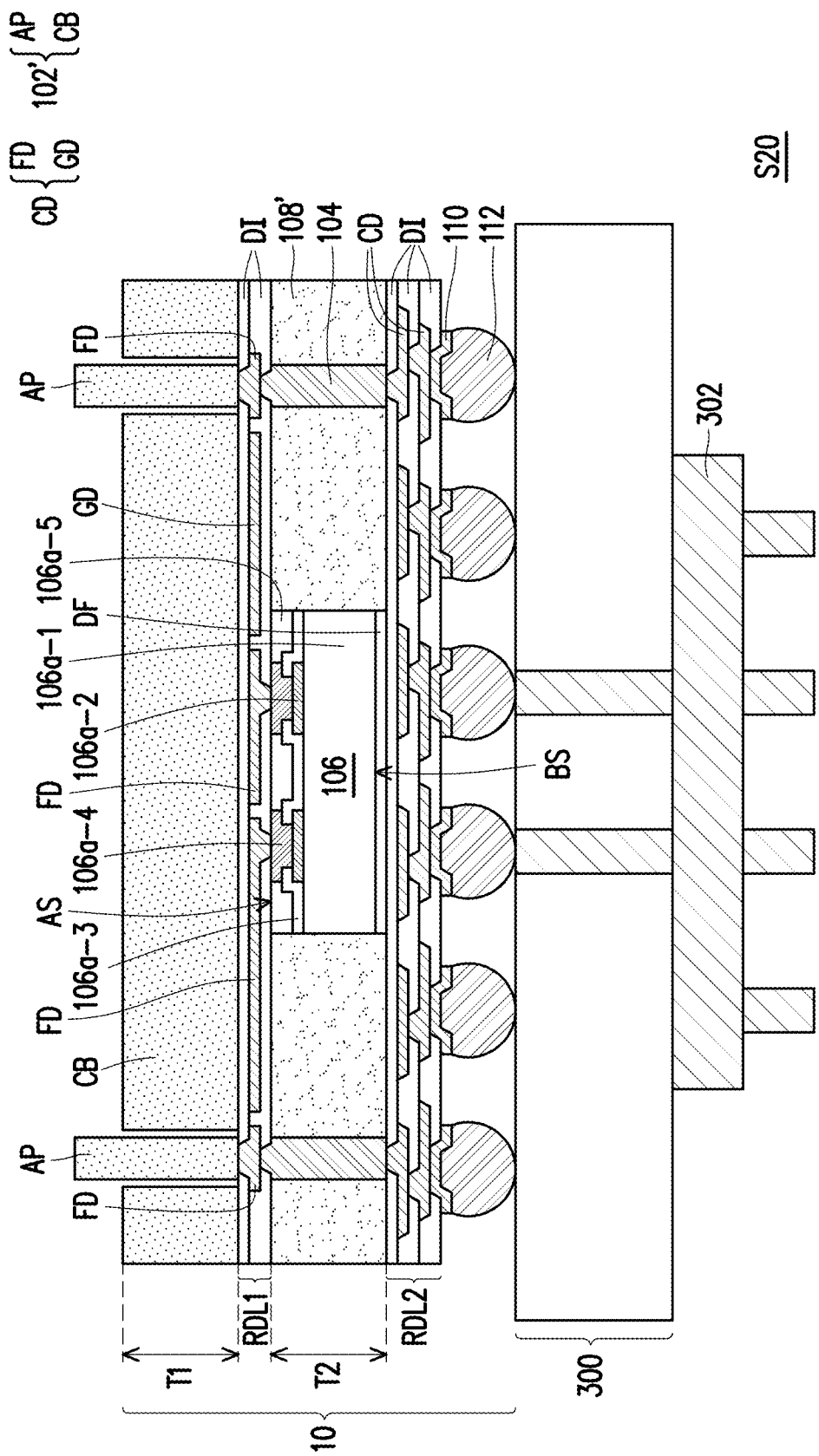
FIG. 4 is a semiconductor device according to some other embodiments of the present disclosure.

FIG. 4 is a semiconductor device according to some other embodiments of the present disclosure. The semiconductor device S20 illustrated in FIG. 4 is similar to the semiconductor device S10 illustrated in FIG. 3, hence the same reference numerals are used to refer to the same or like parts. The difference between the embodiment shown in FIG. 3 and the embodiment shown in FIG. 4, is that the semiconductor die 106 of FIG. 4 is arranged in a face-up manner, and a monopole antenna pattern is used as the antenna patterns AP. In other words, the active surface AS of the semiconductor die 106 is facing the first redistribution layer RDL1, while the backside surface BS of the semiconductor die 106 is facing the second redistribution layer RDL2. Furthermore, in the exemplary embodiment, the conductive posts 106a-4 of the semiconductor die 106 is physically and electrically connected to feed lines FD of the first redistribution layer RDL1, wherein the feed lines FD may be further connected to the antenna patterns AP. For example, in the illustrated embodiment, the antenna patterns AP are monopole antenna patterns AP, wherein the feed lines FD may be physically and electrically connected to the monopole antenna patterns AP. However, the disclosure is not limited thereto, and the design of the antenna patterns AP may be any one of those shown in FIG. 2A to FIG. 2D. Although only two monopole antenna patterns AP are illustrated herein, it should be noted that the number of antenna patterns AP are not limited thereto, and this can be adjusted based on requirement. Furthermore, in certain embodiments, the conductive balls 112 are thermal BGA balls, which may be used for connection to the second heat dissipation element 302 to further enhance the thermal property of the semiconductor device S20.

According to the above embodiments, a conductive carrier is used in replacement of conventional carriers, thus a heat dissipation element having heat dissipation and antenna functions can be directly formed by patterning the conductive carrier. Due to the relatively high metal density of the conductive carrier, it is possible to design a package structure having a heatsink and antenna integrated together to achieve optical thermal dissipation and radiation properties. Furthermore, the heat dissipation element may be designed as a reflector to increase the antenna gain while decreasing the temperature. In addition, since the heat dissipation element is directly defined using the conductive carrier, a de-bonding process for removing the carrier can be omitted. Overall, the heat dissipation and antenna performance properties of the package structure or semiconductor device may be significantly improved.

In accordance with some embodiments of the present disclosure, a package structure including at least one semiconductor die, an insulating encapsulant, a first redistribution layer, a second redistribution layer, a heat dissipation element and a plurality of conductive balls is provided. The insulating encapsulant is encapsulating the at least one semiconductor die, wherein the insulating encapsulant has a first surface and a second surface opposite to the first surface. The first redistribution layer is located on the first surface of the insulating encapsulant, wherein the first redistribution layer includes at least one feed line and one ground plate. The second redistribution layer is located on the second surface of the insulating encapsulant and electrically connected to the at least one semiconductor die and the first redistribution layer. The heat dissipation element is disposed on the first redistribution layer, wherein the heat dissipation element includes a conductive base and a plurality of antenna patterns, the plurality of antenna patterns is electrically connected to the feed line and is electrically coupled to the ground plate of the first redistribution layer. The plurality of conductive balls is disposed on the second redistribution layer.

In accordance with some other embodiments of the present disclosure, a semiconductor device including a circuit substrate, a package structure and a second heat dissipation element is provided. The package structure is disposed on the circuit substrate, wherein the package structure includes at least one semiconductor die, an insulating encapsulant, a first redistribution layer, a second redistribution layer, a heat dissipation element, and a plurality of conductive balls. The insulating encapsulant is encapsulating the at least one semiconductor die, wherein the insulating encapsulant has a first surface and a second surface opposite to the first surface. The first redistribution layer is located on the first surface of the insulating encapsulant, wherein the first redistribution layer includes at least one feed line and one ground plate. The second redistribution layer is located on the second surface of the insulating encapsulant and electrically connected to the at least one semiconductor die and the first redistribution layer. The heat dissipation element is disposed on the first redistribution layer, wherein the heat dissipation element includes a conductive base and a plurality of antenna patterns, the plurality of antenna patterns is electrically connected to the feed line and is electrically coupled to the ground plate of the first redistribution layer. The plurality of conductive balls is disposed on the second redistribution layer. The second heat dissipation element is located on the circuit substrate and electrically connected to the plurality of conductive balls.

In accordance with yet another embodiment of the present disclosure, a method of fabricating a package structure is described. The method includes the following steps. A conductive carrier is provided. A first redistribution layer is formed on the conductive carrier, wherein the first redistribution layer comprises at least one feed line and one ground plate, and the feed line is electrically connected to the conductive carrier. At least one semiconductor die is bonded on the first redistribution layer. An insulating encapsulant is formed to encapsulate the at least one semiconductor die. A second redistribution layer is formed on the insulating encapsulant, wherein the second redistribution is electrically connected to the at least one semiconductor die. A plurality of conductive balls is placed on the second redistribution layer. The conductive carrier is patterned to form a heat dissipation element including a conductive base and a plurality of antenna patterns, wherein the plurality of antenna patterns is electrically connected to the feed line and is electrically coupled to the ground plate of the first redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first redistribution layer on a conductive carrier, wherein the first redistribution layer is physically and electrically connected to the conductive carrier;
   forming a semiconductor die on the first redistribution layer;
   forming a second redistribution layer on the semiconductor die, wherein the second redistribution layer is electrically connected to the semiconductor die and the first redistribution layer;
   removing portions of the conductive carrier to form a conductive base and a plurality of antenna patterns, wherein the plurality of antenna patterns is electrically connected to a feed line and is electrically coupled to a ground plate of the first redistribution layer.

2. The method according to claim 1, wherein the portions of the conductive carrier are removed to form air openings that define the plurality of antenna patterns, and the air openings are exposing a top surface of the first redistribution layer.

3. The method according to claim 2, wherein the air openings define a plurality of slot antenna patterns or a plurality of loop antenna patterns in the conductive base.

4. The method according to claim 1, wherein the portions of the conductive carrier are removed to form air openings, and forming the plurality of antenna patterns further comprises placing a plurality of conductive poles in the air openings to define a plurality of monopole antenna patterns.

5. The method according to claim 1, wherein after forming the conductive base and the plurality of antenna patterns, a dicing process is performed to cut through the first redistribution layer, the second redistribution layer and the conductive base to form separated package structures.

6. The method according to claim 1, wherein the portions of the conductive carrier are removed by a laser drilling process or a chemical etching process.

7. The method according to claim 1, wherein the conductive base is formed with a thickness that is greater than a thickness of the first redistribution layer.

8. A method, comprising:
   providing a conductive carrier having a first thickness;
   forming a conductive layer disposed on and electrically connected to the conductive carrier;
   forming through insulator vias electrically connected to the conductive layer;
   forming an insulating encapsulant on the conductive layer and encapsulating the through insulator vias, wherein a ratio of the first thickness of the conductive carrier to a second thickness of the insulating encapsulant is in a range of 1:1 to 1:5;
   after forming the insulating encapsulant, patterning the conductive carrier to form a plurality of antenna openings in the conductive carrier.

9. The method according to claim 8, further comprises forming dielectric layers on the conductive carrier to surround the conductive layer, wherein after patterning the conductive carrier to form the plurality of antenna openings, the plurality of antenna openings reveals a surface of the dielectric layers.

10. The method according to claim 8, wherein the plurality of antenna openings defines a plurality of slot antenna patterns or a plurality of loop antenna patterns.

11. The method according to claim 8, wherein the plurality of antenna openings defines a plurality of patch antennas and reflectors in the conductive carrier, and the reflectors are physically separated from the plurality of patch antennas.

12. The method according to claim 8, further comprising forming a redistribution layer on the insulating encapsulant and electrically connected to the through insulator vias, wherein a thickness of the redistribution layer is smaller than the first thickness of the conductive carrier.

13. The method according to claim 12, further comprising:
 forming a plurality of conductive balls on the redistribution layer; and
 performing a dicing process by cutting through the conductive carrier, the insulating encapsulant and the redistribution layer to form a package structure.

14. The method according to claim 13, further comprising:
 mounting the package structure onto a circuit substrate, wherein the circuit substrate comprises a heat dissipation element that is electrically connected to the plurality of conductive balls.

15. A method, comprising:
 forming a package structure, which comprises
  forming a first redistribution layer on a heat dissipation element;
  forming a second redistribution layer on the first redistribution layer, wherein an insulating encapsulant is sandwiched in between the first redistribution layer and the second redistribution layer;
  patterning the heat dissipation element to form a plurality of antenna patterns in the heat dissipation element; and
  performing a dicing process to form the package structure, wherein after forming the package structure, sidewalls of the heat dissipation element are aligned with sidewalls of the first redistribution layer, sidewalls of the second redistribution layer, and sidewalls of the insulating encapsulant.

16. The method according to claim 15, wherein the dicing process cut through the heat dissipation element, the first redistribution layer, the insulating encapsulant and the second redistribution layer to form the package structure.

17. The method according to claim 15, wherein the heat dissipation element is patterned by a laser drilling process or a chemical etching process.

18. The method according to claim 15, wherein forming the plurality of antenna patterns comprises forming a plurality of slot antenna patterns or a plurality of loop antenna patterns.

19. The method according to claim 15, wherein the first redistribution layer is formed with a plurality of conductive layers and a plurality of dielectric layers, and a volume occupied by the plurality of conductive layers is smaller than a volume occupied by the heat dissipation element in the package structure.

20. The method according to claim 15, further comprises:
 mounting the package structure onto a circuit substrate, wherein the circuit substrate comprises a second heat dissipation element that is electrically connected to the second redistribution layer of the package structure.

* * * * *